(12) United States Patent
Leach et al.

(10) Patent No.: US 10,591,557 B2
(45) Date of Patent: Mar. 17, 2020

(54) APPARATUS AND METHOD FOR INTRODUCTION OF A MATERIAL INTO A CRYOGENIC SYSTEM

(71) Applicant: General Electric Company, Schenectady, NY (US)

(72) Inventors: Andrew Michael Leach, Clifton Park, NY (US); James Richard Trigger, Rotterdam Junction, NY (US); John Arthur Urbahn, Saratoga Springs, NY (US)

(73) Assignee: General Electric Company, Schenectady, NY (US)

( * ) Notice: Subject to any disclaimer, the term of this patent is extended or adjusted under 35 U.S.C. 154(b) by 1952 days.

(21) Appl. No.: 13/662,595

(22) Filed: Oct. 29, 2012

(65) Prior Publication Data

US 2013/0047633 A1    Feb. 28, 2013

Related U.S. Application Data

(63) Continuation-in-part of application No. 12/418,649, filed on Apr. 6, 2009, now abandoned.

(51) Int. Cl.
| | | |
|---|---|---|
| *F25D 3/10* | (2006.01) | |
| *F25D 31/00* | (2006.01) | |
| *G01R 33/28* | (2006.01) | |
| *G01R 33/31* | (2006.01) | |
| *G01R 33/30* | (2006.01) | |

(Continued)

(52) U.S. Cl.
CPC ............. *G01R 33/282* (2013.01); *F17C 3/085* (2013.01); *G01R 33/307* (2013.01); *G01R 33/31* (2013.01); *G01R 33/62* (2013.01)

(58) Field of Classification Search
CPC ............................. F17C 3/085; G01R 33/282
USPC ...... 62/51.1, 101, 476, 477, 480, 6; 324/307, 324/309, 319, 321
See application file for complete search history.

(56) References Cited

U.S. PATENT DOCUMENTS

| | | |
|---|---|---|
| 5,611,207 A | 3/1997 | Hess |
| 2005/0188705 A1 | 9/2005 | Jones et al. |
| 2006/0101832 A1 | 5/2006 | Wurzinger et al. |

(Continued)

FOREIGN PATENT DOCUMENTS

| | | | | |
|---|---|---|---|---|
| EP | 905524 A1 | * | 3/1999 | |
| GB | 2395545 A | * | 5/2004 | ............. F17C 3/085 |
| WO | 2006077361 A2 | | 7/2006 | |

OTHER PUBLICATIONS

Advantages of corrugated tubes. HRS Spiral Tube. Published Mar. 15, 2007. Accessed at http://www.hrs-spiratube.es/en/resources/advantages-of-corrugated-tubes.aspx.*

(Continued)

*Primary Examiner* — Tareq Alosh (57) ABSTRACT

Provided is an apparatus and method comprising, an airlock chamber; a cryogenic chamber; an equilibrator positioned between the airlock chamber and the cryogenic chamber that is configured to allow for the passage of a sample along to the cryogenic chamber; and a cooling unit that is thermally coupled to the equilibrator. Collectively, the airlock chamber, equilibrator, and the cryogenic chamber define a travel path. A machine-readable medium, comprising instructions which when executed by a controller causes a sample to be cooled, is also provided.

12 Claims, 12 Drawing Sheets

(51) Int. Cl.
 *G01R 33/62* (2006.01)
 *F17C 3/08* (2006.01)

(56) References Cited

U.S. PATENT DOCUMENTS

2006/0207265 A1* 9/2006 Sorsby ........................ 62/47.1
2008/0242974 A1 10/2008 Urbahn et al.
2012/0117985 A1* 5/2012 Urbahn et al. ................ 62/45.1

OTHER PUBLICATIONS

J. Wolber et al. "Generating highly polarized nuclear spins in solution using dynamic nuclear polarization," Science Direct, Nuclear Instruments and Methods in Physics Research, vol. 526, pp. 173-181.
PCT/US2010/030044 Search Report, dated Jul. 19, 2010.
PCT/US2010/030044 Written Opinion of Search report, dated Jul. 14, 2010.
A. M. Leach et al., "Methods for Dynamic Filtration of Pharmaceutical Products," U.S. Appl. No. 13/292,468, filed November 9, 2011.
J. A. Urbahn et al., Fluid Path System for Dissolution and Transport of a Hyperpolarized Material, U.S. Appl. No. 13/350,189, filed Jan. 13, 2012.
Unofficial English translation of Office Action issued in connection with corresponding CN Application No. 201080026121.3 dated Oct. 29, 2013.

\* cited by examiner

APPARATUS AND METHOD FOR INTRODUCTION OF A MATERIAL INTO A CRYOGENIC SYSTEM

CROSS-REFERENCE TO RELATED APPLICATIONS

This application is a Continuation-In-Part (CIP) Application of commonly assigned, U.S. patent Ser. No. 12/418,649, entitled "APPARATUS AND METHOD FOR INTRODUCTION OF A MATERIAL INTO A CRYOGENIC SYSTEM", filed on Apr. 6, 2009, the contents of which are hereby incorporated by reference in their entirety.

BACKGROUND

Dynamic nuclear polarization (DNP) is a technique that generates an excess of one nuclear spin relative to the other orientation. This excess can be on the order of several thousand-fold at cryogenic temperatures and several hundred thousand-fold at room temperature. This increase in population of one nuclear spin relative to the other is seen as an increase in the signal-to-noise ratio of measurements in nuclear magnetic resonance (NMR) systems such as magnetic resonance imagers (MRI).

To achieve high levels of polarization via DNP, materials or samples must be cooled to extremely low temperatures, often less than four Kelvin and optimally in the range of one Kelvin. These low temperatures are typically achieved by reducing the pressure above a volume of liquid helium. As the pressure above the helium bath is reduced the temperature of the bath is reduced as defined by the saturation curve of liquid helium. The introduction of warm samples into this environment can significantly impact the temperature of the helium bath as well as the polarization of any samples that are already present in the bath. Additionally, the process of cooling samples results in the vaporization of liquid helium from the helium bath, impacting the duration the helium bath can be maintained and the number of samples that can be processed.

A conventional means of reducing the pressure above a helium bath is the use of one or more mechanical pumps. These pumps expel helium into the ambient environment as a result of this pumping process, making it difficult and expensive to reuse the cryogen. The quantity of helium in this bath can be either static, being filled before the pumping is initiated, or dynamic through the use of a second helium reservoir connected to the pumped region via a regulated passageway such as a needle valve. The static system often exhibits a limited operational period due to size constraints of the helium bath. The dynamic system, although more flexible, contains mechanical components within the cryogenic environment, potentially limited the robustness of the device.

A sorption pump may be used in a closed cycle cryogenic system that is designed to generate one-Kelvin temperatures without loosing cryogen (liquid helium) volume. This sorption pump contains a charcoal-based sorbent that absorbs gaseous helium at low temperatures, thus acting as a means to reduce the pressure above a volume of liquid helium. When the temperature of the charcoal is elevated the gaseous helium is released from the sorption pump, thus acting as a source of helium for the liquid helium bath. This sorption pump may be operated in a cyclic fashion that first condenses liquid helium and then reabsorbs the helium while generating reduced temperatures. In this cyclic manner of operation the total volume of cryogen remains constant. The fact that this system operates without loosing cryogen volume is a significant benefit to ease of operation by eliminating the need for frequent cryogen transfers as well as a cost savings through the elimination of cryogen purchases.

However, a limitation of this system is that during the condensation portion of the sorption pump cycle, the volume of liquid helium generated is limited by several geometric considerations including the mass of charcoal, the amount of gaseous helium loaded into the charcoal and the physical size of the container into which the helium is condensed. Because of this limited volume of liquid helium the amount of heat directed to the helium bath directly impacts the amount of material or number of samples that can be cooled and polarized during one thermal cycle.

Accordingly, there is a need to improve upon current cooling systems and methodologies.

BRIEF DESCRIPTION

The present invention overcomes at least some of the aforementioned drawbacks by providing an apparatus and method for cooling material in a cryogenic system with minimal impact to the thermal performance of the system by directing heat from the introduced material away from the liquid helium bath and to a cooling unit. In an embodiment, an apparatus is provided. The apparatus comprises an airlock chamber; a cryogenic chamber; an equilibrator positioned between the airlock chamber and the cryogenic chamber configured to allow for passage of a sample along to the cryogenic chamber; and a cooling unit thermally coupled to the equilibrator, further wherein the airlock chamber, equilibrator, and the cryogenic chamber define a travel path.

In another embodiment a sample cooling system comprises: a sample introducing element; a first cooling means configured for provide conductive cooling of a sample; a second cooling means configured to provide convective cooling of the sample; and a cryogenic helium bath, wherein the sample introducing element, the first cooling means, the second cooling means, and the cryogenic helium bath define a travel path.

In another embodiment a method for cooling a sample is provided comprising loading the sample into an airlock chamber; evacuating the airlock chamber; moving the sample from the airlock chamber towards a equilibrator, said equilibrator located between the airlock chamber and a cryogenic helium path; conducting heat from the sample at the equilibrator to a cooling unit, via a thermal linkage; and convecting heat from the sample while iteratively lowering the sample into the cryogenic helium bath.

In another embodiment a machine-readable medium, comprising instructions which when executed by a controller causes a sample to be cooled, is provided.

BRIEF DESCRIPTION OF THE DRAWINGS

The drawings illustrate an embodiment presently contemplated for carrying out the invention.

DETAILED DESCRIPTION

The following detailed description is exemplary and not intended to limit the invention of the application and uses of the invention. Furthermore, there is no intention to be limited by any theory presented in the preceding background of the invention or the following detailed description of the drawings.

Provided herein are methods and apparatus for the introduction of a sample into a cryogenic system from ambient temperatures. Cryogenic systems are often used in medical imaging, power generation and scientific research applications. Cryogenic systems are also used in apparatuses for hyperpolarization of samples and are described in co-owned U.S. patent application Ser. No. 11/692,642, U.S. patent application Ser. No. 11/766,881, U.S. patent application Ser. No. 13/292,468, and U.S. patent application Ser. No. 13/350,189 which are hereby incorporated by reference in their entirety.

Figure 1:
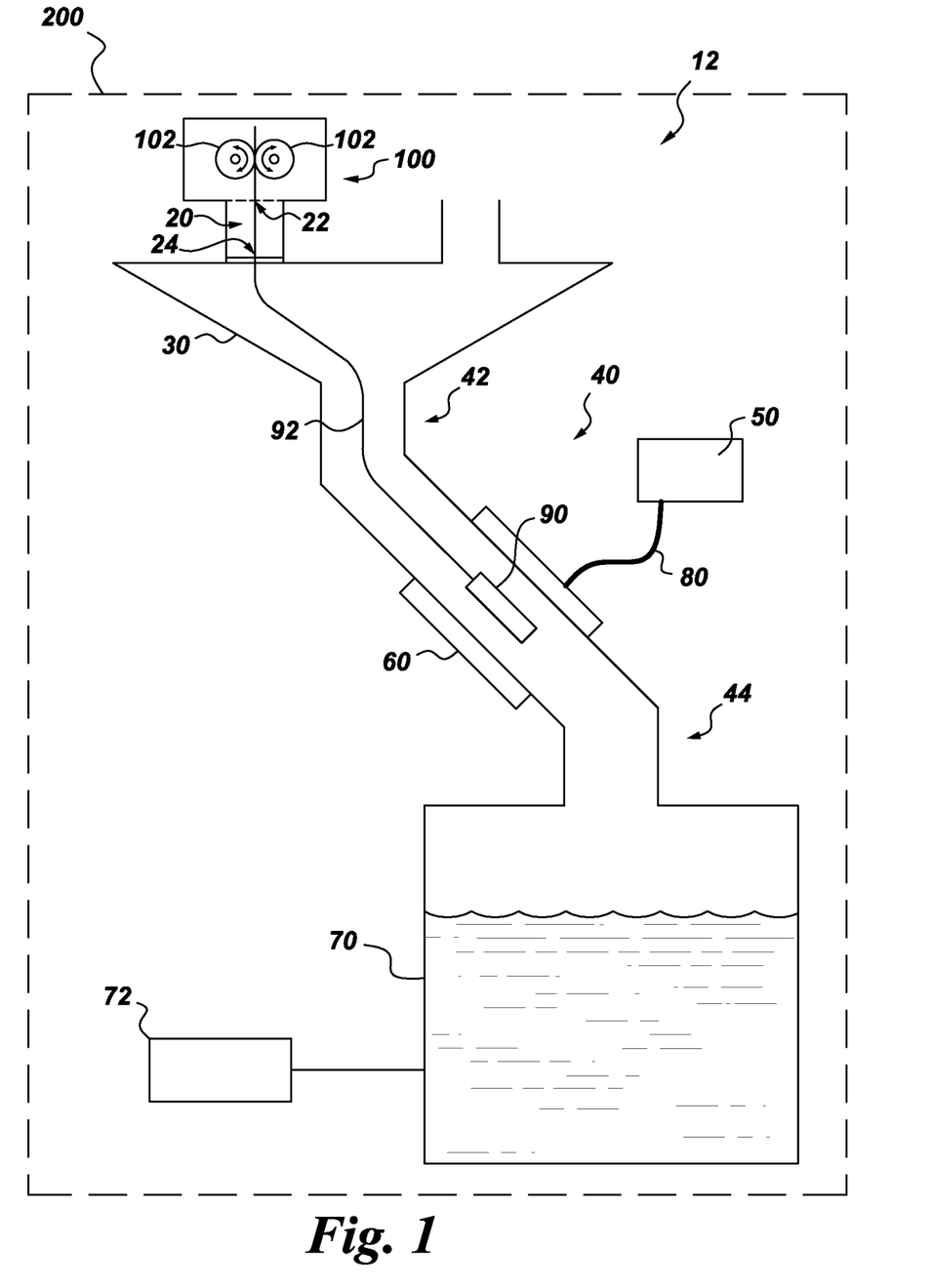
FIG. 1 is a schematic illustration of a system for cooling a sample, according to an embodiment of the present invention.

In one embodiment as shown in FIG. 1, an apparatus for introducing and cooling a sample 90 of a material into a cryogenic chamber 70 from ambient temperature is provided. The apparatus 12 includes an airlock chamber 20 on one end and distal to a cryogenic chamber 70 on the other end and a equilibrator 60 that is thermally linked to a cooling unit 50 therebetween. The airlock chamber 20, cryogenic chamber 70, and equilibrator 50 are configured so as to define a travel path 10 (see e.g., FIGS. 4A-4E, 5A-5C, and 6).

The dimension and geometry of the travel path may vary based on the application. The travel path may consist of a series of separate segments. In one embodiment, the travel path may comprise tubing 40 that comprises two thin walled tubes 42, 44 located at opposing ends of an equilibrator 60. The equilibrator 60 is a tubular structure comprised of a high thermally conductive material, such as copper, and is thermally linked to a cooling unit 50. The two thin walled tubes 42, 44 may be comprised of a low thermally conductive material such as steel. The tubes 42, 44 may also be corrugated so as to reduce the conductive thermal loads. To minimize radiative heating, the sample path or travel path 10 may be configured to geometrically offset the two tubes 42, 44 located at opposing end of the equilibrator 60 such that there is no direct line of sight from the entrance of the first tube 42 to the exit of the second tube 44. Such an offset can be established by fixing the two tubes 42, 44 parallel to one another but laterally offset with the equilibrator 60. The diameters of the tubes 42, 44 may be minimized to restrict heat loads, but be of sufficient diameter to allow samples 90 to pass therethrough.

As the airlock chamber 20 may comprise a dynamic seal or baffle 22 and a gate valve 24.

If multiple samples 90 are to be admitted to the cryogenic chamber 70 a common travel path may be used. Such a common path may use a funnel 30 at the entrance of the first steel tube 42 to direct multiple samples 90 to the cryogenic helium chamber 70. In an embodiment, the helium chamber 70 may comprise a cryogenic helium bath. An example of the tubing 40 is two 0.750-inch inner diameter corrugated tubes connected to a 0.750-inch inner diameter copper tube. The first corrugated steel tube is attached to a funnel 30 that enables the simultaneous direction of four or more samples to the helium bath 70. The samples 90 are 0.125-inch outer diameter tubes with 0.500-inch outer diameter bulbs located at the distal tips. The inner diameter of the tubing 40 is large enough to simultaneously accommodate one sample bulb and three sample tubes. This configuration dictates that although four samples 90 can be present in the helium bath 70 simultaneously, only one sample 90 can be moved though the 0.750-inch inner diameter tubing 40 at a given point in time. The cooling unit 50 employed in this arrangement may be a two stage Sumitomo SRDK-415D cryogenic cooling system. In other embodiments, the cooling unit 50 may be a cryogen cooling system operating at a temperature of approximately four Kelvin such as any Gifford-McMahon (GM) type cyrocooler.

One or more samples 90 may be initially loaded into the airlock chamber 20, via the dynamic seal or baffle 22, where the surrounding air is removed and replaced with a cryogenic gas such as helium. The pressure in this airlock chamber 20 is reduced to more closely match the pressure within the cryogenic bath 70 and apparatus 12. A dynamic seal or baffle 22 at the upper portion of the airlock chamber 20 may be used to maintain pressure. At least one sample 90 is lowered from the airlock chamber 20 through a gate valve 24 into the funnel 30 and then the distal end of the first tube 42, and directed to the equilibrator 60. The sample 90 is positioned within the equilibrator 60 where contact with the highly conductive material of the equilibrator 60 allows for conduction of heat from the sample 90 to the cooling unit 50.

Imperfections in the surface of the sample 90 and the equilibrator 60 may limit the amount of heat transferred via conduction, thus convective cooling may also be used to transfer heat from the sample 90 to the equilibrator 60. To generate an environment suitable for convection, a limited quantity of heat may be directed to the cryogenic helium bath 70 resulting in a modest increase in pressure within the travel path of the entire apparatus 12.

In one embodiment, the cryogenic bath 70 contains liquid helium. The magnitude of this pressure increase is directly related to the temperature of the liquid helium and thus this pressure increase is typically small in order to not impact the processing of other samples 90, which may reside in the bath 70. Pressures of 0.055 and 0.096 millibar can be achieved within the second tube 44 while only increasing the helium bath's 70 temperature to 0.90 and 0.95 Kelvin, respectively, based on the liquid helium saturated vapor pressure relationship. In practice it is desirable to maintain this pressure below 0.1 millibar. However, this maximum temperature excursion is balanced by the need for rapid sample 90 introduction into the helium bath 70. Higher pressures and thus temperatures will enhance heat flow from the warm sample 90 to the cryogenic refrigerator, thus enabling the acceleration of sample introduction, but at the cost of increase temperature fluctuations within the cryogenic helium bath 70.

Figure 5A:
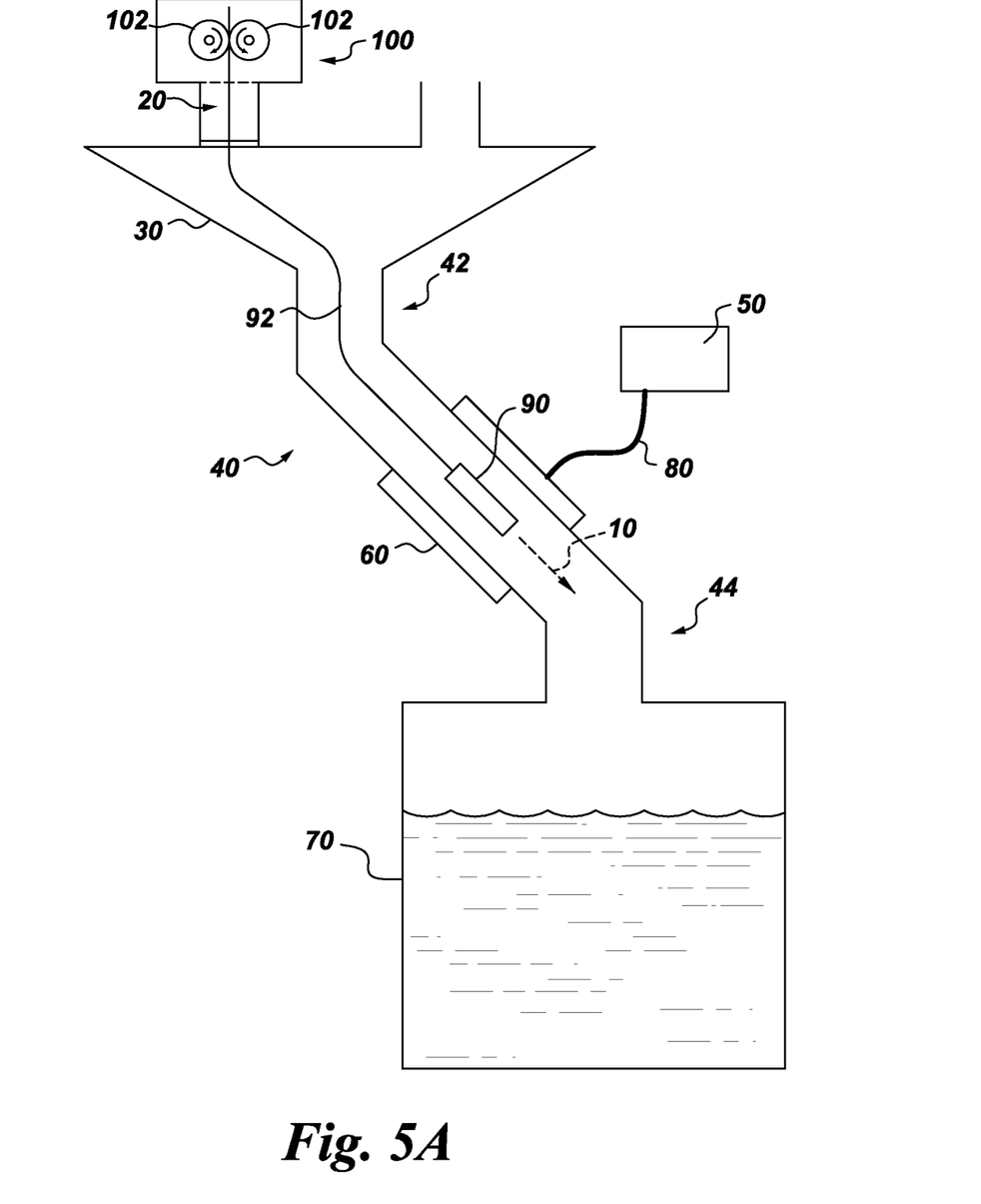
FIGS. 5A-5C are schematic illustrations showing a progression of a sample undergoing a unidirectional cooling method provided by a system, according to embodiments of the present invention.
Figure 5B:
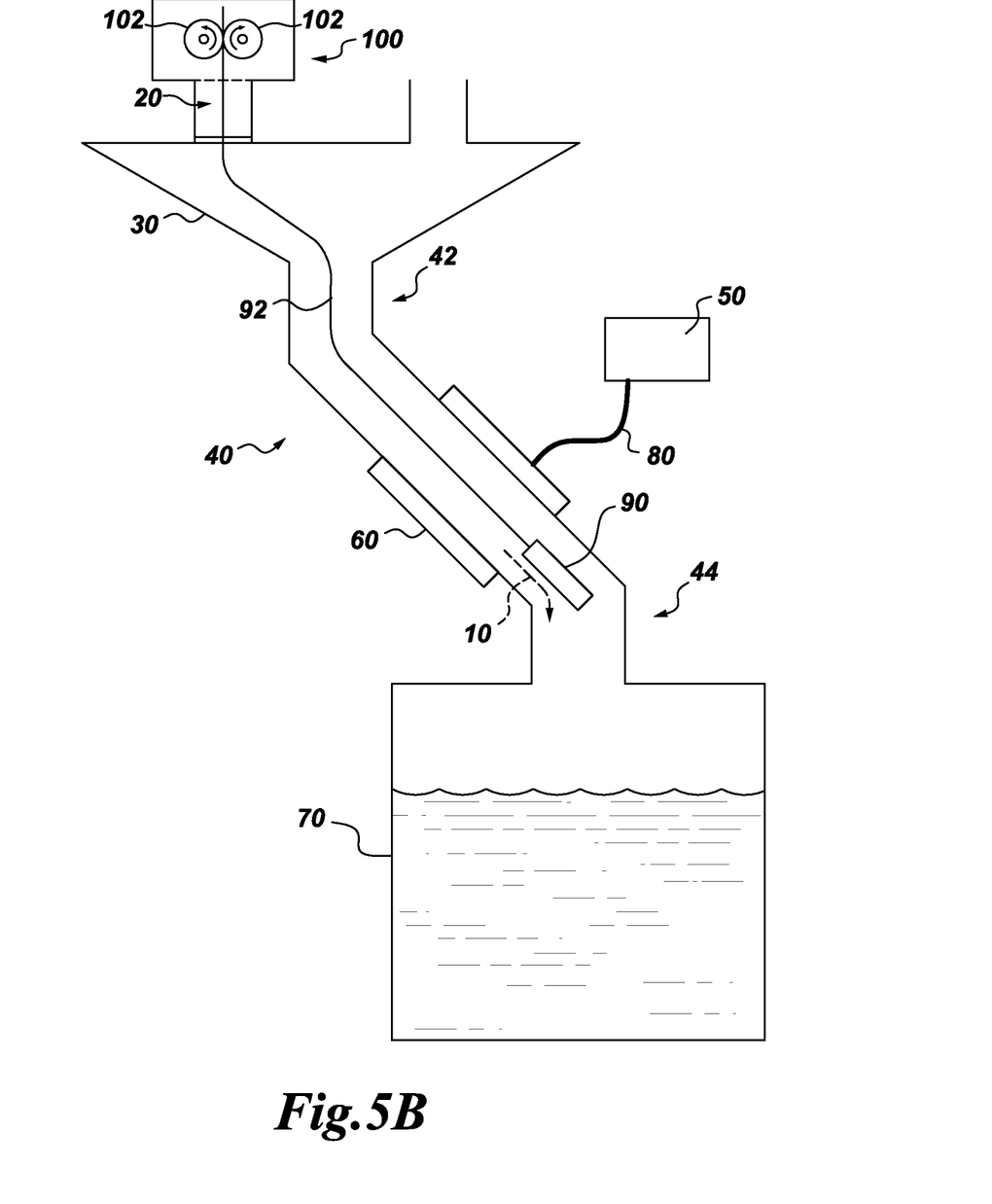
Figure 5C:
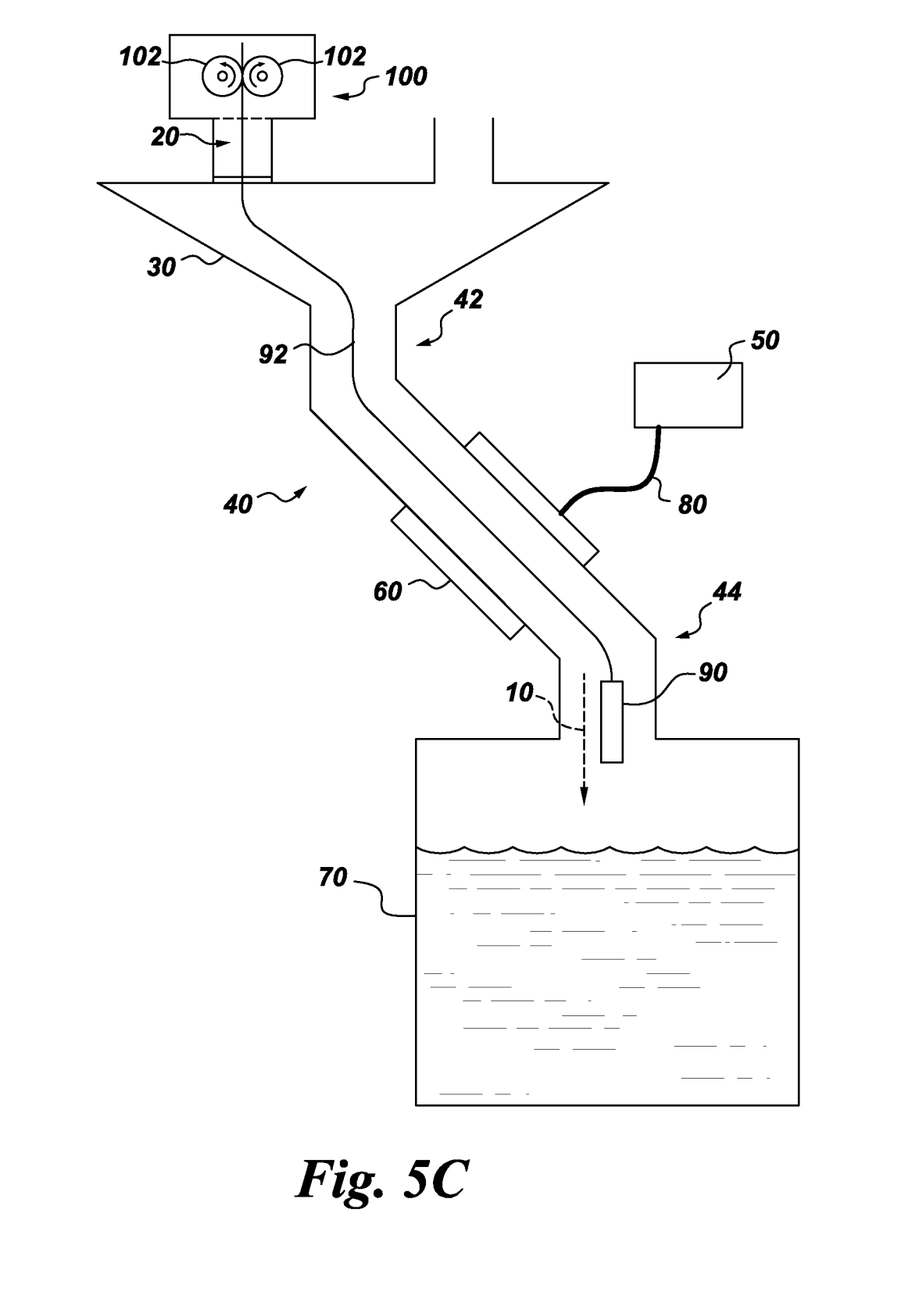

As is shown in progressive steps in FIGS. 5A-5C (i.e., unidirectional cooling method) and FIG. 6 convective cooling may be utilized by introducing a sample 90 in to the system 12 and positioning the sample 90 below the equilibrator 60 in successive steps, where each step brings the sample 90 closer to the cryogenic helium bath 70. The path of travel of the sample 90 is indicated as element 10. After each repositioning of the sample 90 a time delay allows helium gas, collected in the sample path space during the repositioning process, to transfer heat from the sample 90 to the equilibrator 60 via convection. In one embodiment, the values for this sample 90 introduction procedure include three five-centimeter movements (5, 10 and 15 cm below the equilibrator 60) with five-minute delays between movements. The number, location and duration of repositioning steps may be empirically determined and adjusted based on operating conditions and geometry of the system.

In one embodiment, a positioning system 100 may be used to position samples 90 within this sample path in a manner that would control conductive and convective heat transfer from samples 90 to the equilibrator 60. The positioning system 100 may be manual motion based on graduated markings on a sample delivery device. Alternatively, robotic systems 102 with feedback control may be used to precisely control the location of the sample 90 within the travel path 10. Such a robotic system 102 may be fabricated from pitch wheels that drive a sample delivery device into the sample path. The pitch wheels may further provide feedback regarding sample 90 positioning through the use of an idler wheel that measures sample 90 slippage. The sample 90 may be lowered and/or raised by the movement of pitch wheels 102 in contact with a linear element 92 that is connected to the sample 90.

Figure 6:
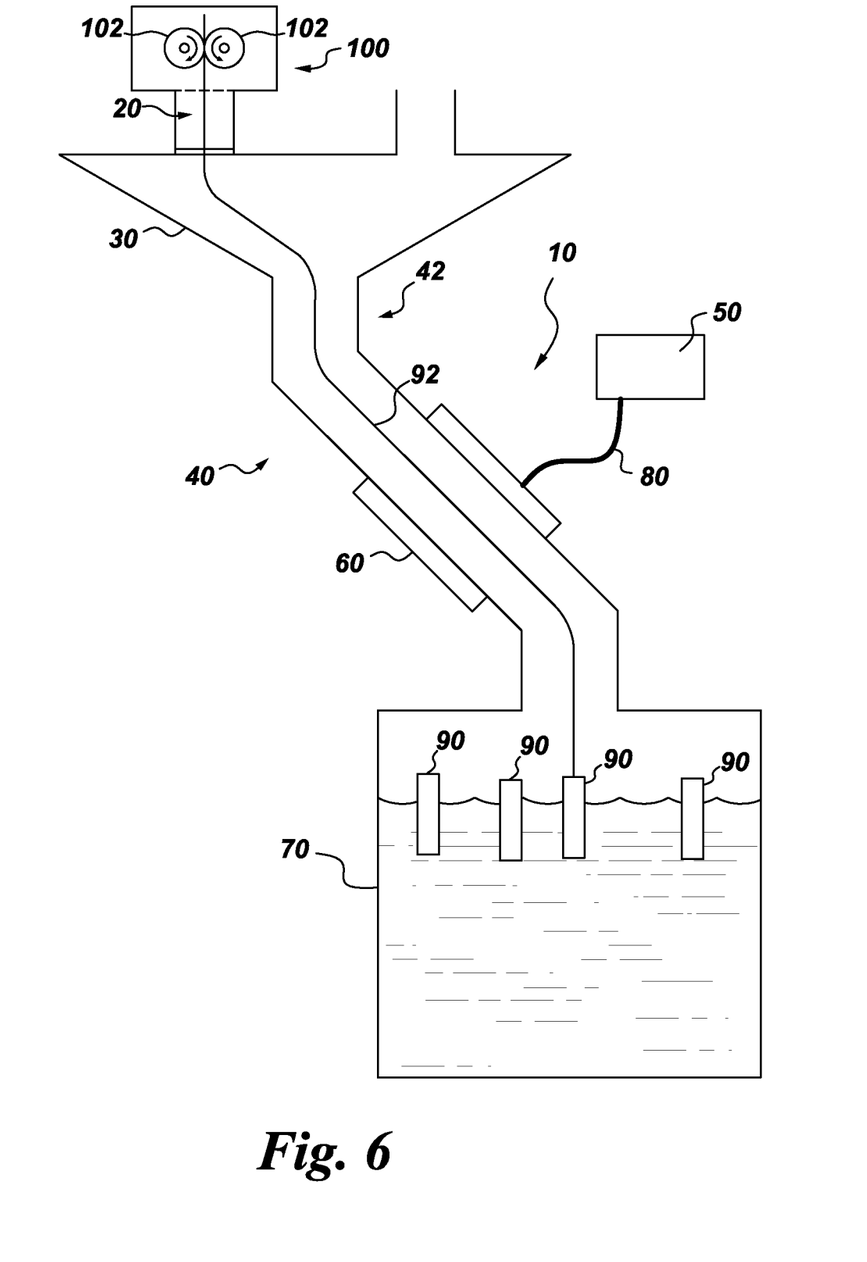
FIG. 6 is a schematic illustration showing a group of samples that have undergone either of the cooling methods in FIGS. 4A-4E and in FIGS. 5A-5C, according to embodiments of the present invention.

After the final repositioning step the sample 90 may be introduced into the cryogenic helium bath 70 with minimal impact on the helium bath 70 temperature (See e.g., FIG. 6). This method provides a method for thermal conditioning of samples 90, by controlling the distance between the sample 90 and the equilibrator 60 during successive steps, which may limits the transfer of heat to the equilibrator 60 while simultaneously allowing for heat transfer to be directed to the cryogenic helium bath 70.

In one embodiment of the sample 90 introduction method, the sample 90 may be positioned below the equilibrator 60 for brief durations to increase pressure within the travel path 10 due to collection of helium gas (See e.g., FIG. 4B), and then returned to the equilibrator 60 (See e.g., FIG. 4C) to allow for enhanced transfer of heat from the sample to the equilibrator 60 rather than the cryogenic helium bath 70. To generate this increase in pressure within the sample path the sample 90 may be lowered to successively lower positions before returning to the equilibrator 60 for heat transfer (e.g., FIGS. 4A-4E). For example, a sample introduction procedure may include six steps where the sample 90 is positioned 3.75, 5.00, 5.56, 5.63, 5.75 and 10.00 cm below the equilibrator 60 for five seconds before returning to the equilibrator 60 for delays of two minutes to allow for heat transfer. The number, location and duration of these steps may be determined empirically and may be changed based on the geometry and conditions.

Figure 3:
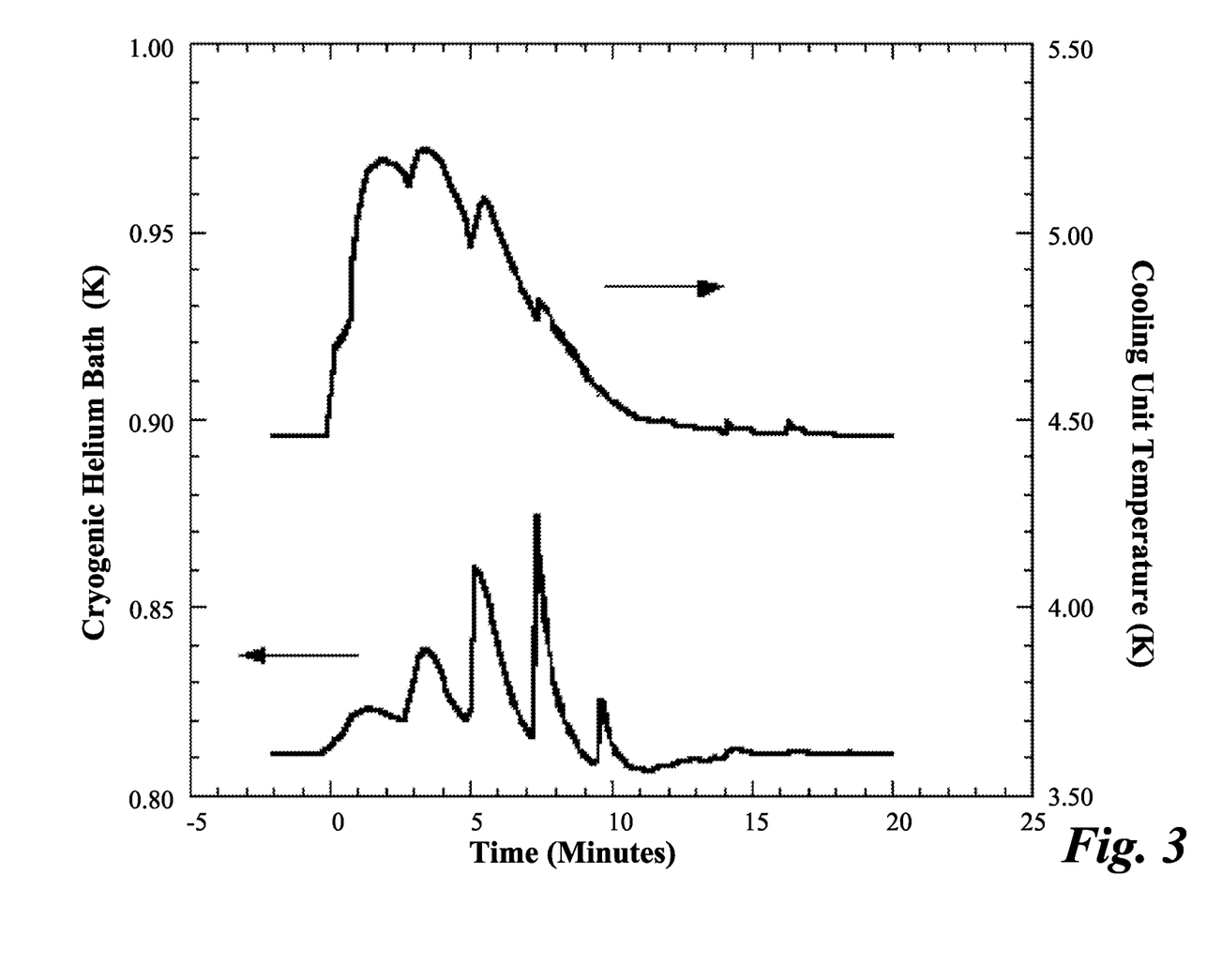
FIG. 3 is a thermal profile of the cryogenic helium bath and cooling unit using the bidirectional sample loading procedure, according to an embodiment of the present invention.
Figure 4A:
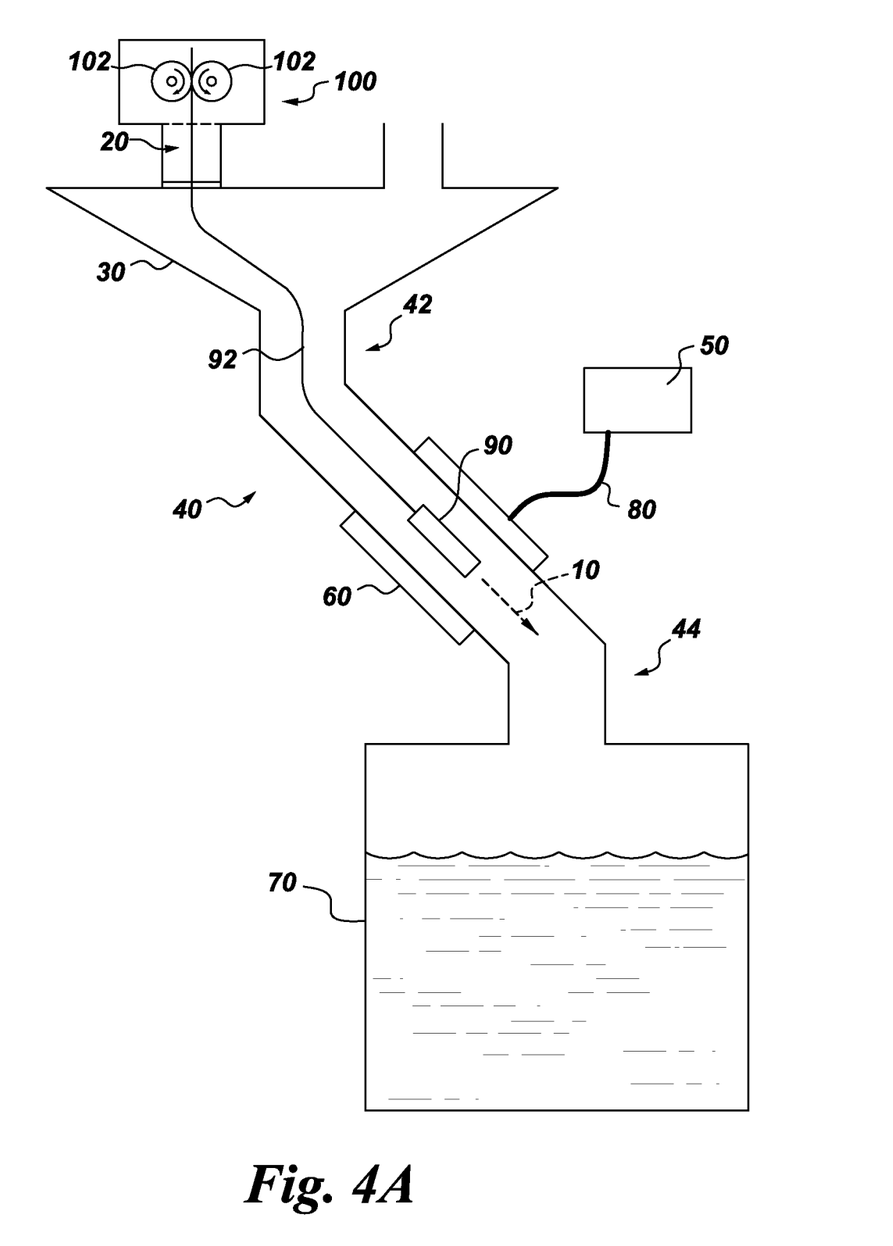
FIGS. 4A-4E are schematic illustrations showing a progression of a sample undergoing a bidirectional cooling method provided by a system, according to embodiments of the present invention.
Figure 4B:
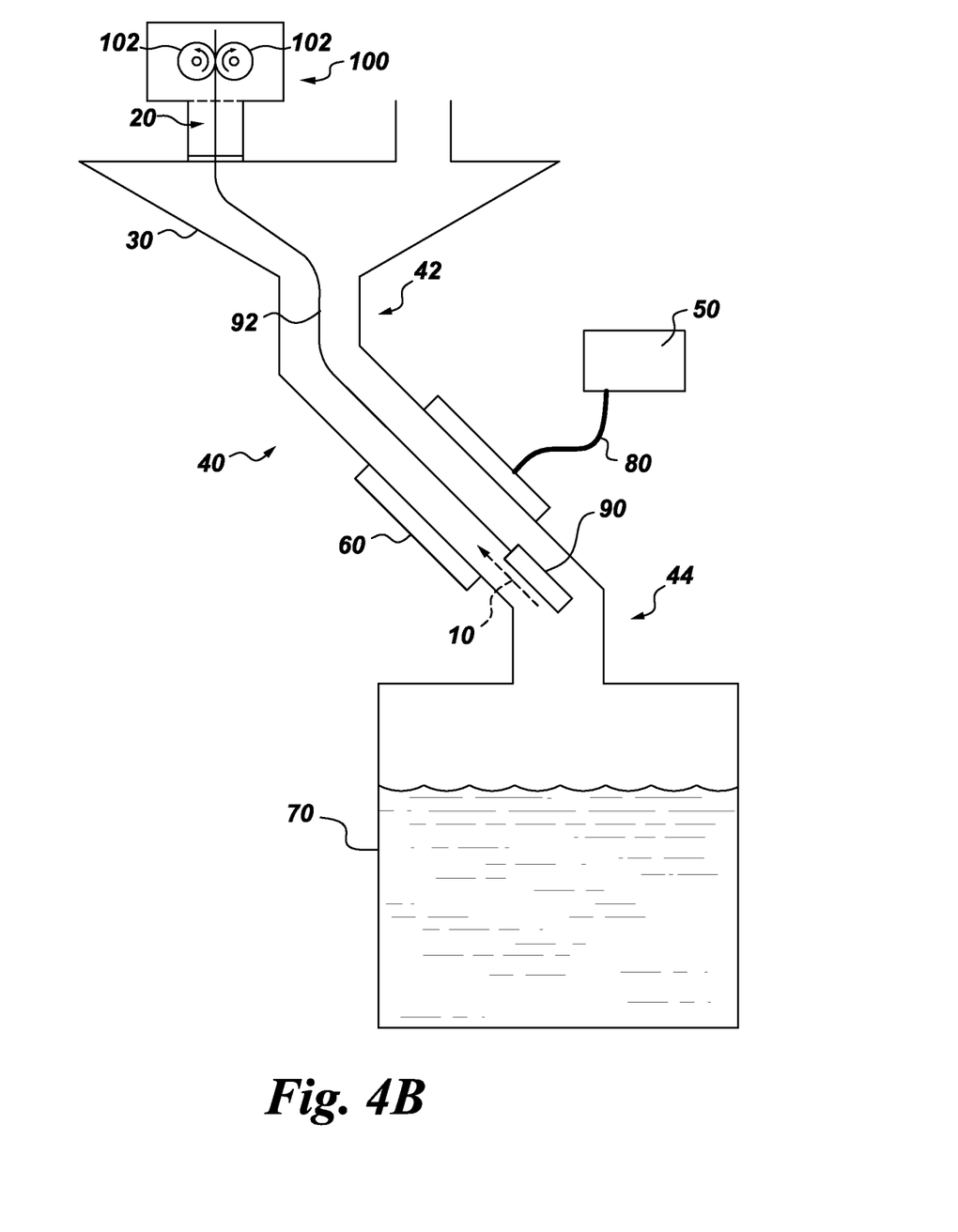
Figure 4C:
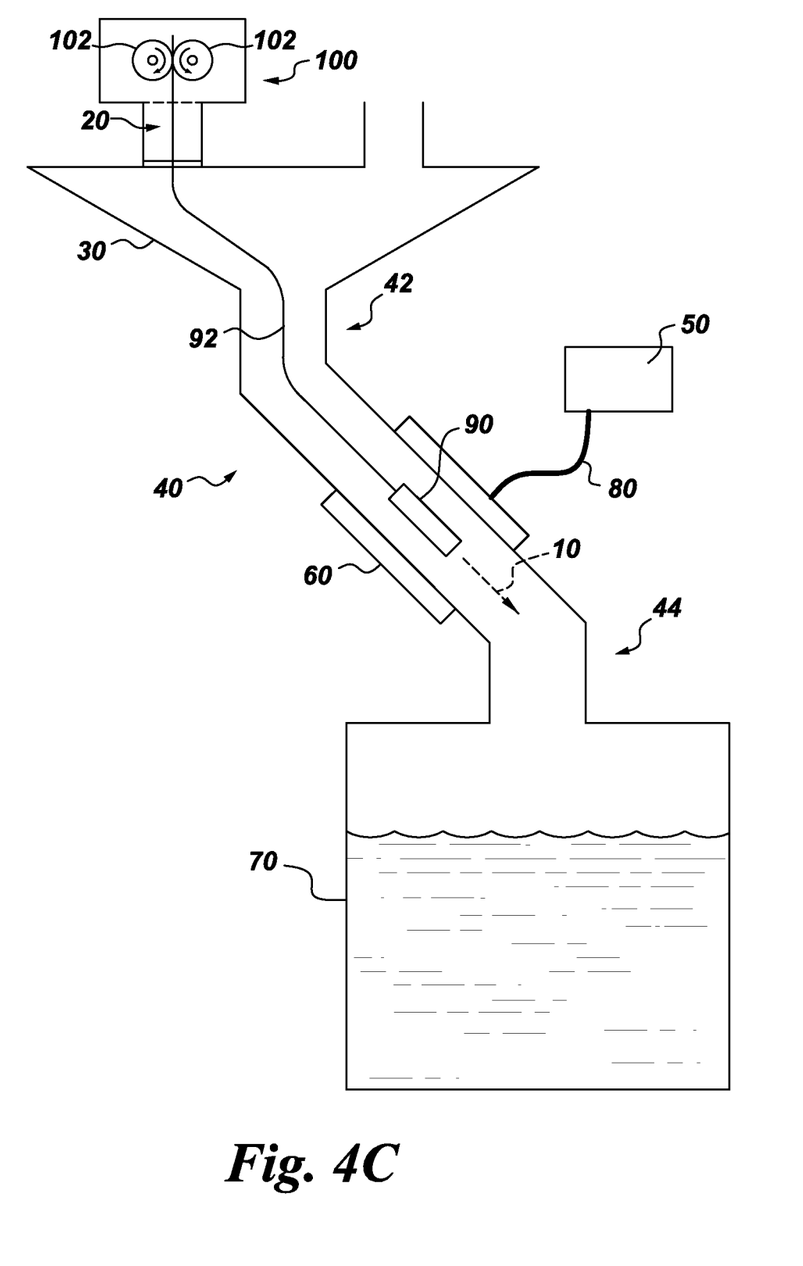
Figure 4D:
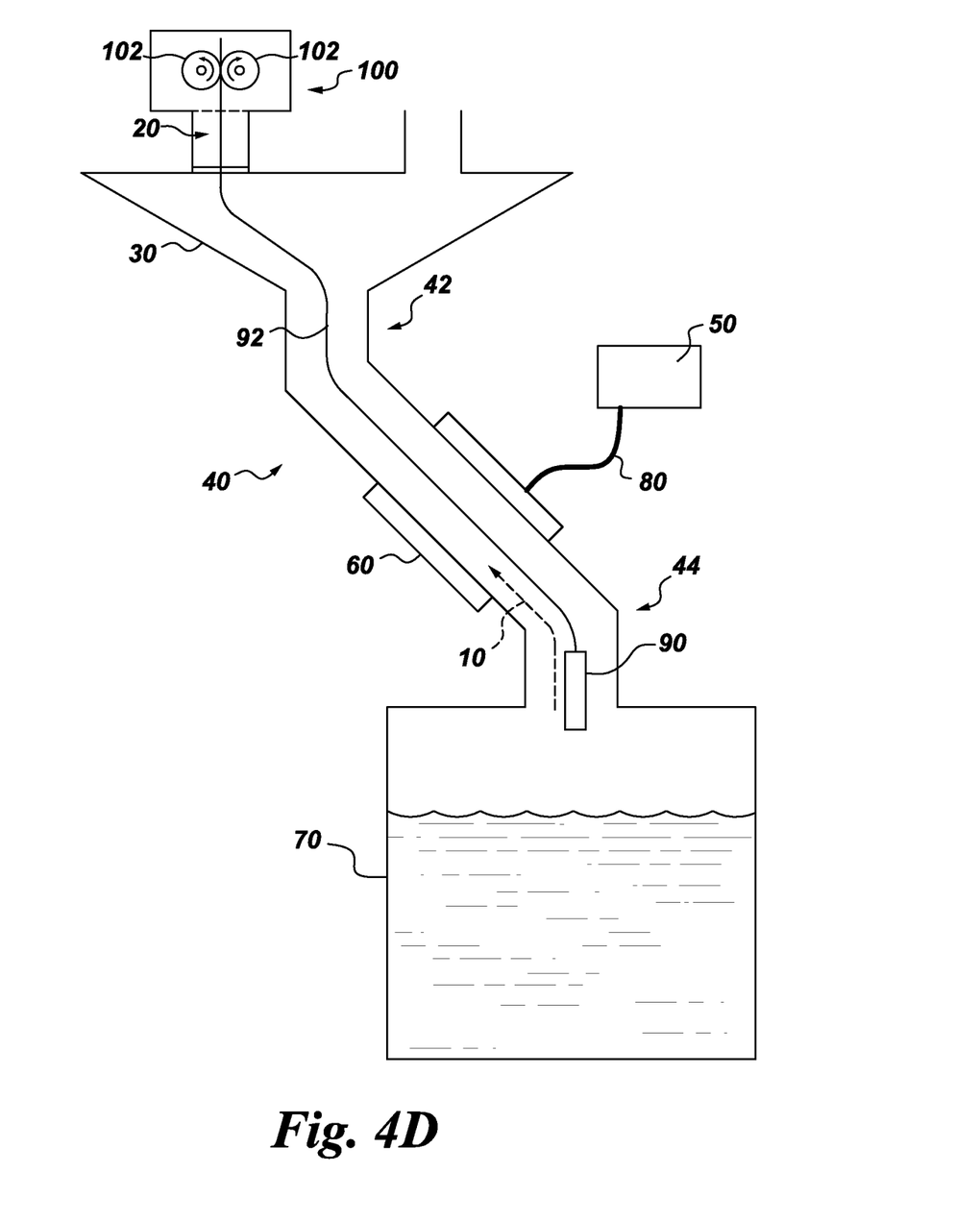
Figure 4E:
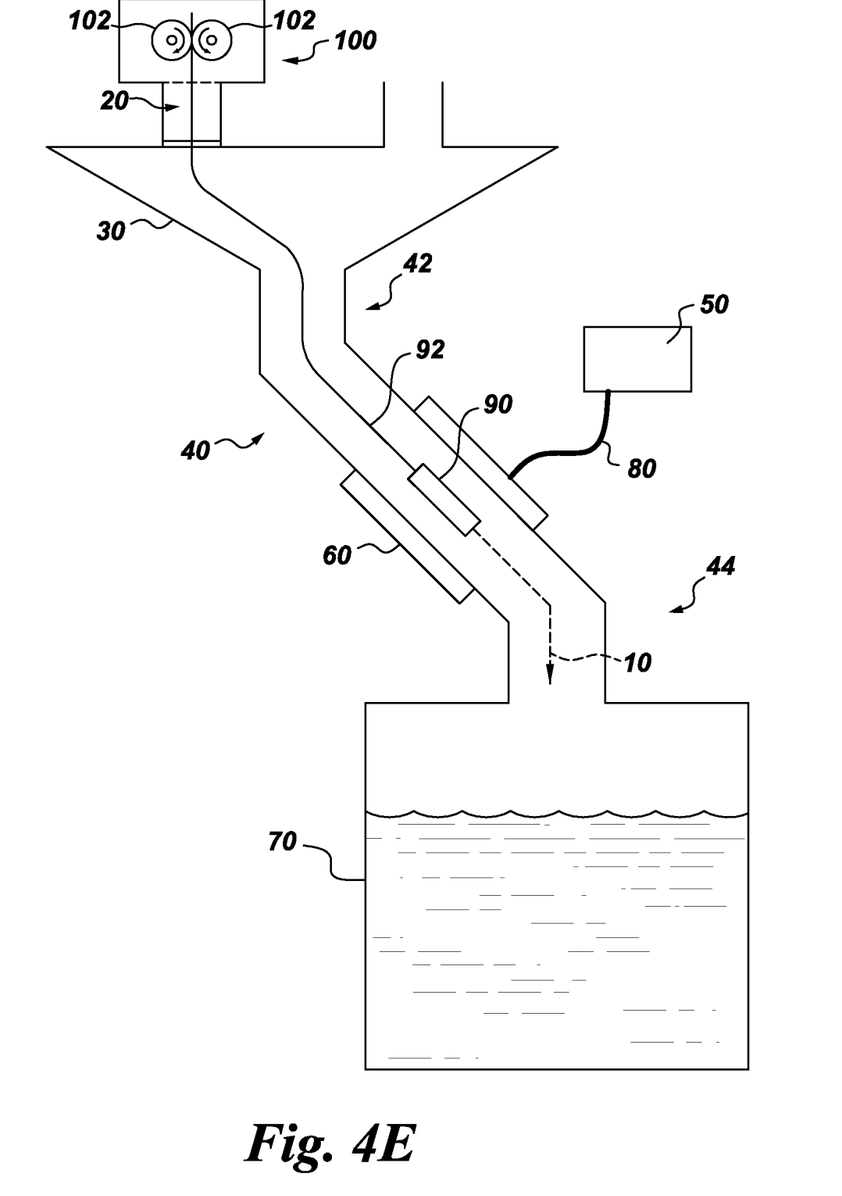

An advantage of using successive steps in lowering and repositioning a sample 90 may be that the sample 90 related heat loads are predominately directed to a cooling unit rather than the liquid volume of the cryogenic bath 70. The impact on the temperature of the cryogenic liquid volume resulting from the introduction of samples 90 is minimized. In this manner, as shown for example in FIG. 6, multiple samples 90 (e.g., four) may be cooled and concurrently kept cool in the helium bath 70 to temperatures below 1 Kelvin, as illustrated in FIG. 3. By using convective and conductive cooling the apparatus 12 is able to cool one, or more, samples 90 to temperatures below 1 Kelvin in a total time that may be less than 10 minutes, as illustrated in FIG. 3.

In another embodiment, the invention provides a method to allow a modest increase in gas pressure of the cryogenic bath coolant within the sample path during equilibration steps. This increase in pressure can be achieved through introduction of a warm sample 90 in the headspace above the cryogenic helium bath 70. A combination of conductive, convective, and radiative heating from the warm sample 90 to the cooled helium bath 70 will result in a local increase in pressure and thus an increase in convective heat transfer to the surrounding environment. A portion of the convective heat will be directed to the highly conductive portion of the travel path 10 and transferred to the cooling unit 50 via the thermal linkage 80. The magnitude of the pressure increase and the proximity of the warm sample 90 relative to the highly conductive section of the travel path 10 will dictate the percentage of heat directed to the cooling unit 50 relative to the cryogenic helium bath 70. The heat flow to the cooling unit 50 may be increased by repositioning the warm sample 90 within the equilibrator 60 region of the sample path following the increase in pressure. This process may be repeated till the sample 90 is sufficiently cooled to introduce the sample 90 to the cryogenic helium bath 70 with minimal impact of the bath's 70 characteristics. The successive lowering in steps of the sample 90, without successive raising of the sample 90, may be understood readily when viewing only FIGS. 5A-5C.

Alternatively, a separate heat source 72 local to the cryogenic helium bath 70 may be used to increase the pressure within the sample path. Although this approach would reduce the need for repositioning of the sample 90 to generate the pressure increase, this approach may introduce an additional heat source into the system thus potentially impacting other system characteristics including helium bath 70 temperature of service life.

By employing successive steps, the impact of the sample loading related heat on the volume of cryogenic liquid in the cryogenic helium bath 70 may be minimized. This may increase the maximum number of samples 90 that can be processed during one cycle of a sorption pump in a cryogenic system 200 be increased. The combination of convective and conductive cooling may also allow rapid cooling of samples 90 without the need for physical movement of mechanical parts within the cryogenic system 200, such as equilibrator 60 components that apply pressure to the sample 90 to enhance conduction.

In one embodiment, a machine-readable medium comprising instructions which when executed by a controller coupled to the cryogenic system 200 may be used. The machine-readable medium may control the loading of samples 90, position of the sample 90 in the sample path, and provide a means for monitoring and controlling temperature and pressure within the cryogenic system 200.

EXAMPLES

Methods on operating the equilibrator were developed by repetitively introducing samples into the cryogenic system and measuring the temperature of the cryogenic helium bath as well as the volume of liquid helium consumed. Cryogenic helium bath temperature was monitored with ruthenium oxide temperature sensors located on the helium bath container. The volume of liquid helium volume consumed per sample was calculated by (1) determining the duration a known quantity of liquid helium would remain in the cryogenic vessel as a result of parasitic heat loads and (2) the decrease in this duration as a result of introducing a known number of samples.

Example 1

Unidirectional Sample Loading Procedure

Figure 2:
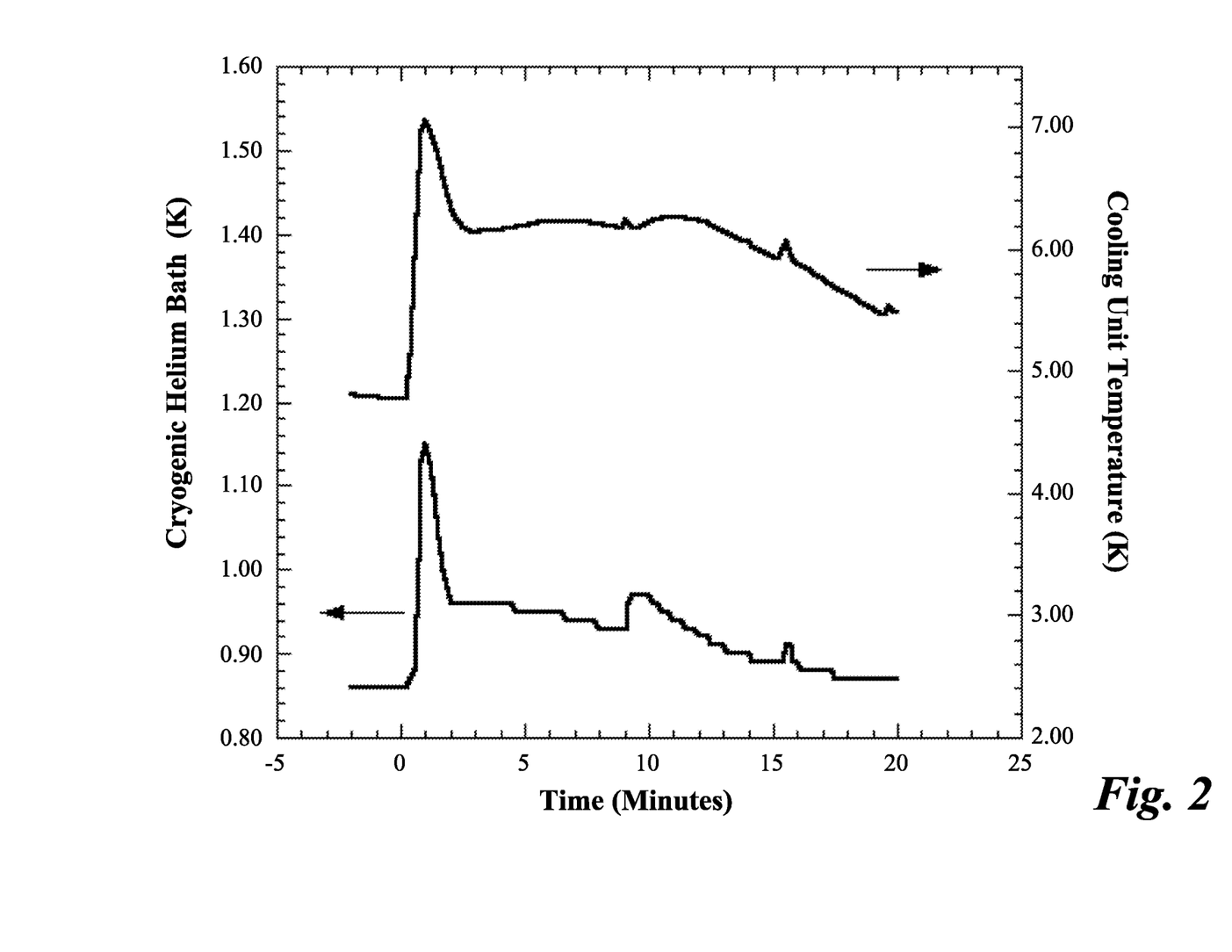
FIG. 2 is a thermal profile of the cryogenic helium bath and cooling unit using the unidirectional sample loading procedure, according to an embodiment of the present invention.

A 2.0 g sample of glycerol was pre-cooled to 77 K prior to introduction into the cryogenic system's airlock. The temperature of this sample increase during the loading process but the exact temperature of the sample prior to movement into the cryogenic system's sample path is unknown. The sample was lower to the equilibrator where it was allowed to remain for six minutes. Next, the sample was lowered to a position five centimeters below the equilibrator and allowed to remain for six minutes. The sample was then positioned 10 centimeters below the equilibrator and allowed to remain for six minutes. Finally the sample was inserted into the cryogenic helium bath. An example of the temperature of the cryogenic helium bath and the temperature of the cooling unit during sample loading is shown in FIG. 2. The unidirectional sample loading method is shown at FIGS. 5A-5C and 6.

Example 2

Bidirectional Sample Loading Procedure

A 0.8 g sample of pyruvic acid was warmed to room temperature (nominally 293 K) prior to introduction into the cryogenic system. The sample was lower to the equilibrator where it remained for three minutes. The sample was then lowered to 3.75 cm below the equilibrator where it remained for five seconds before returning to the equilibrator where it remained for two minutes. This procedure was repeated to depths of 5.00, 5.56, 5.63, and 5.75 cm below the equilibrator in successive steps. The sample was then lowered to 10 cm below the equilibrator where it was allowed to remain for two minutes. Finally the sample was inserted into the cryogenic helium bath. An example of the temperature of the cryogenic helium bath and the temperature of the cooling unit during sample loading is shown in FIG. 3. Using this method approximately 4% of the samples heat was directed to the cryogenic helium bath corresponding to 22 cc/sample of helium consumed. The bidirectional sample loading method is shown at FIGS. 4A-4E and 6.

The invention may be embodied in other specific forms without departing from the spirit or essential characteristics thereof. The foregoing embodiments are therefore to be considered in all respects as illustrative rather than limiting on the invention described herein. The scope of the invention is thus indicated by the appended claims rather than by the foregoing description, and all changes that come within the meaning and range of equivalency of the claims are therefore intended to be embraced therein.

We claim:

1. An apparatus comprising:
   an airlock chamber;
   a cryogenic chamber;
   an equilibrator positioned between the airlock chamber and the cryogenic chamber configured to allow for passage of a sample along to the cryogenic chamber;
   a first tube positioned between the airlock chamber and the equilibrator;
   a second tube positioned between the equilibrator and the cryogenic chamber; and
   a cooling unit thermally coupled to the equilibrator, further wherein the airlock chamber, the first tube, the equilibrator, the second tube, and the cryogenic chamber define a sample travel path, further wherein the first tube and the second tube are parallel to each other and laterally offset from the equilibrator.

2. The apparatus of claim 1, wherein at least one of the first tube and the second tube are corrugated.

3. The apparatus of claim 1, wherein the cryogenic chamber comprises a cryogenic helium bath.

4. The apparatus of claim 1, wherein said airlock chamber further comprises a dynamic seal or baffle.

5. The apparatus of claim 1 wherein the cooling unit is a refrigeration unit, a stored liquid or solid cryogen cooling system, or a continuous flow cryostat.

6. The apparatus of claim 1, wherein the cooling unit is connected to the equilibrator by a thermal refrigeration link.

7. The apparatus of claim 6, wherein at least a portion of the thermal refrigeration link is made of copper.

8. The apparatus of claim 1, further comprising a funnel positioned between the airlock chamber and the first tube.

9. The apparatus of claim 1, further comprising a positioning system to control the position of a sample in the travel path.

10. The apparatus of claim 9, wherein the positioning system comprises a robotic system with feedback control to control the location of the sample along the travel path.

11. The apparatus of claim 1 further comprising a heat source coupled to the cryogenic chamber configured to increase pressure within the travel path.

12. The apparatus of claim 1, wherein the apparatus is configured to allow a simultaneous cooling of at least four samples in the cryogenic chamber.

* * * * *